(12) United States Patent
An

(10) Patent No.: US 9,324,765 B2
(45) Date of Patent: Apr. 26, 2016

(54) SEMICONDUCTOR LIGHT EMITTING APPARATUS COMPRISING CONNECTING PLATE

(75) Inventor: Sang Jeong An, Gyeonggi-do (KR)

(73) Assignee: Sang Jeong An, Gyeonggi-Do (KR)

( * ) Notice: Subject to any disclaimer, the term of this patent is extended or adjusted under 35 U.S.C. 154(b) by 0 days.

(21) Appl. No.: 14/234,709

(22) PCT Filed: Jul. 17, 2012

(86) PCT No.: PCT/KR2012/005676
§ 371 (c)(1),
(2), (4) Date: Jan. 24, 2014

(87) PCT Pub. No.: WO2013/015551
PCT Pub. Date: Jan. 31, 2013

(65) Prior Publication Data
US 2014/0175472 A1 Jun. 26, 2014

(30) Foreign Application Priority Data

Jul. 26, 2011 (KR) ........................ 10-2011-0074191

(51) Int. Cl.
*H01L 33/00* (2010.01)
*H01L 21/00* (2006.01)
*H01L 27/15* (2006.01)
(Continued)

(52) U.S. Cl.
CPC .......... *H01L 27/156* (2013.01); *H01L 25/0753* (2013.01); *H01L 33/60* (2013.01); *H01L 33/62* (2013.01); *H01L 27/15* (2013.01); *H01L 27/153* (2013.01); *H01L 31/0232* (2013.01); *H01L 33/504* (2013.01); *H01L 2224/48137* (2013.01)

(58) Field of Classification Search
CPC ... H01L 33/62; H01L 27/156; H01L 25/0753; H01L 2224/48137; H01L 31/0232; H01L 27/153; H01L 33/58; H01L 33/60; H01L 33/504; H01L 27/15
See application file for complete search history.

(56) References Cited

U.S. PATENT DOCUMENTS

| 7,192,659 B2 * | 3/2007 | Ricks et al. ................... 428/690 |
| 7,736,920 B1 * | 6/2010 | Wu et al. ......................... 438/22 |

(Continued)

FOREIGN PATENT DOCUMENTS

| KR | 10-2006-0065954 | 6/2006 |
| KR | 10-0599012 | 7/2006 |

(Continued)

OTHER PUBLICATIONS

International Search Report issued in priority PCT application No. PCT/KR2012/005676 dated Dec. 28, 2012; 7 pgs.

(Continued)

*Primary Examiner* — Alonzo Chambliss
(74) *Attorney, Agent, or Firm* — Harness, Dickey & Pierce, P.L.C.

(57) ABSTRACT

The present disclosure provides a semiconductor light emitting apparatus, comprising a first light emitting unit having a current supplying layer formed at the bottom; a second light emitting unit having a current supplying layer formed at the bottom and extended into the second light emitting unit; a connecting plate including a conductive portion where the first light emitting unit is placed and a conductive portion where the second light emitting unit is placed; and an electric pass for electrically connecting the first light emitting unit and the second light emitting unit.

20 Claims, 9 Drawing Sheets

(51) Int. Cl.
*H01L 33/60* (2010.01)
*H01L 25/075* (2006.01)
*H01L 33/62* (2010.01)
*H01L 33/50* (2010.01)
*H01L 31/0232* (2014.01)

(56) References Cited

U.S. PATENT DOCUMENTS

| | | |
|---|---|---|
| 8,008,683 B2 | 8/2011 | Choi et al. |
| 8,129,207 B2 | 3/2012 | Lee |
| 2004/0104395 A1* | 6/2004 | Hagimoto et al. ............. 257/79 |
| 2007/0069220 A1* | 3/2007 | Ogihara ......................... 257/79 |
| 2008/0017871 A1 | 1/2008 | Lee et al. |
| 2008/0057603 A1* | 3/2008 | Wang et al. ................... 438/27 |
| 2009/0272991 A1 | 11/2009 | Lee et al. |
| 2010/0219431 A1* | 9/2010 | Hasnain ................. H01L 27/15 257/93 |
| 2010/0264449 A1* | 10/2010 | Hayashi .......................... 257/98 |
| 2011/0103038 A1* | 5/2011 | Song ............................... 362/84 |

FOREIGN PATENT DOCUMENTS

| | | |
|---|---|---|
| KR | 10-2008-0028663 | 4/2008 |
| KR | 10-2010-0044726 | 4/2010 |

OTHER PUBLICATIONS

Written Opinion issued in priority PCT application No. PCT/KR2012/005676 dated Dec. 28, 2012; 7 pgs.

* cited by examiner

SEMICONDUCTOR LIGHT EMITTING APPARATUS COMPRISING CONNECTING PLATE

CROSS-REFERENCE TO RELATED APPLICATIONS

This application is a U.S. national stage filing under 35 U.S.C. §371 of International Application No. PCT/KR2012/005676 filed Jul. 17, 2012, and claims priority to Korean Application No. 10-2011-0074191 filed Jul. 26, 2011. The disclosures of the aforementioned applications are incorporated herein by reference in their entireties.

FIELD

The present disclosure relates generally to a semiconductor light emitting apparatus, and more particularly, to a connected body to which a plurality of semiconductor light emitting units or parts is connected in series and/or parallel.

BACKGROUND

This section provides background information related to the present disclosure which is not necessarily prior art.

FIG. 1 is a view illustrating an example of a lamp employing light emitting diodes, in which a lighting system 100 has a rectifier 110, a regulator 120, and a lamp portion 130 including a plurality of serially connected light emitting diodes A and B. An applied power undergoes a rectifying and smoothing operation before it is fed to the plurality of serially connected light emitting diodes A and B.

FIG. 2 is a view illustrating an example of a serial connection of light emitting diodes, in which a substrate 200 (e.g. a sapphire substrate), a light emitting part or light emitting diode A, and a light emitting part or light emitting diode B are provided. Each of the light emitting parts A and B includes an n-type semiconductor layer 210 (e.g. GaN), an active layer 220 (e.g. InGaN), a p-type semiconductor layer 230 (e.g. GaN). The p-type semiconductor layer 230 is provided with p-side electrodes 240, and the n-type semiconductor layer is provided with n-side electrodes 250. For a serial connection of the light emitting parts A and B, a metal layer 270, running across the top of a dielectric layer 280, connects the p-side electrode 240 of the light emitting part A and the n-side electrode 250 of the light emitting part B.

FIG. 3 is a view illustrating another example of a serial connection of light emitting diodes, in which a package or lamp 300 has a light emitting part A, a light emitting part B, a phosphor film 310 applied onto the light emitting parts A and B, and a lens 320 formed over the phosphor film 310. The light emitting part A and the light emitting part B can be connected in series by means of a wire 330, and they can be electrically connected to outside by means of wires 340 and 350. Additional wires 330 may be required to connect those light emitting parts A and B having the same configuration together.

FIG. 4 is a view illustrating yet another example of a serial connection of light emitting diodes, in which an integrated monolithic light emitting diode chip 400 includes a substrate 493, and light emitting parts A, B and C that are serially connected over the substrate 493. The light emitting parts A, B and C each have an n-type semiconductor layer 410, an active layer 420, and a p-type semiconductor layer 430, but they do not have an insulating substrate 200 as in the light emitting diode of FIG. 2. An n-side pad 440, a conductive layer 491, a deposited metal film 470, and a p-side pad 450 are all involved in the serial connection of the light emitting parts A, B and C. Among other elements that are not yet explained, reference numeral 480 denotes a dielectric layer, and reference numeral 492 denotes a reflective film for reflecting light generated in the active layer 420. However, producing such a monolithic light emitting diode chip 400 constructed as above encounter several disadvantages, that is to say, a number of processes are needed to serially connecting those light emitting parts A, B and C, a problem in any of the light emitting parts may cause a problem for the entire monolithic light emitting diode chip 400, the manufacturing process is difficult, the reliability of the process is not ensured, and so on.

SUMMARY

The problems to be solved by the present disclosure will be described in the latter part of the best mode for carrying out the invention.

This section provides a general summary of the disclosure and is not a comprehensive disclosure of its full scope or all of its features.

According to one aspect of the present disclosure, there is provided a semiconductor light emitting unit connected body comprising: a first light emitting unit which includes a first semiconductor layer of a first conductivity type, a second semiconductor layer of a second conductivity type different from the first conductivity type, an active layer interposed between the first semiconductor layer and the second semiconductor layer, and a current supplying layer formed at the bottom; a second light emitting unit which includes a first semiconductor layer of a first conductivity type, a second semiconductor layer of a second conductivity type different from the first conductivity type, an active layer interposed between the first semiconductor layer and the second semiconductor layer, and a current supplying layer formed at the bottom and extended into the second light emitting unit; a connecting plate to which the first and second light emitting units are fixed, the connecting plate having a conductive portion where the first light emitting unit is placed, and a conductive portion where the second light emitting unit is placed; and an electric pass for electrically connecting one of the first and second semiconductor layers in the first light emitting unit with one of the first and second semiconductor layers in the second light emitting unit, wherein the electrically connected semiconductor layers have different conductive type from each other.

The advantageous effects of the present disclosure will be described in the latter part of the best mode for carrying out the invention.

DETAILED DESCRIPTION

Hereinafter, the present disclosure will now be described in detail with reference to the accompanying drawings.

Figure 4:
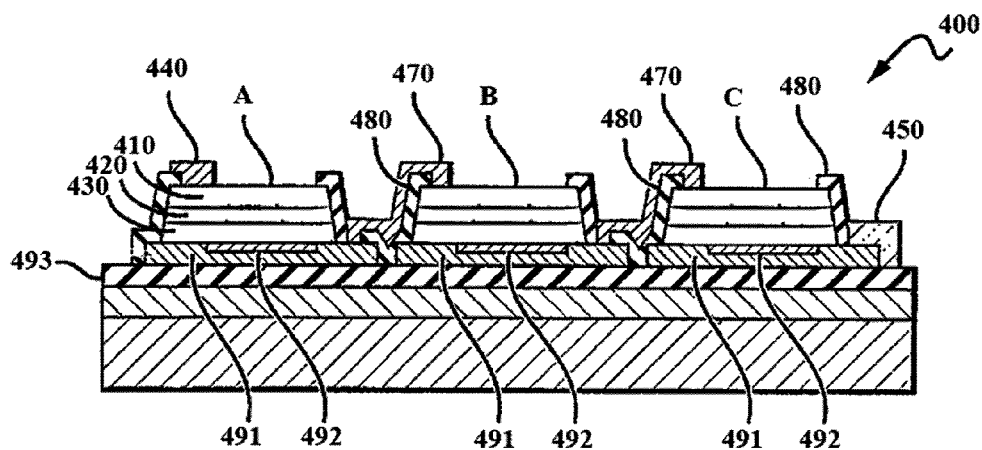
FIG. 4 is a view illustrating yet another example of a serial connection of light emitting diodes.
Figure 5:
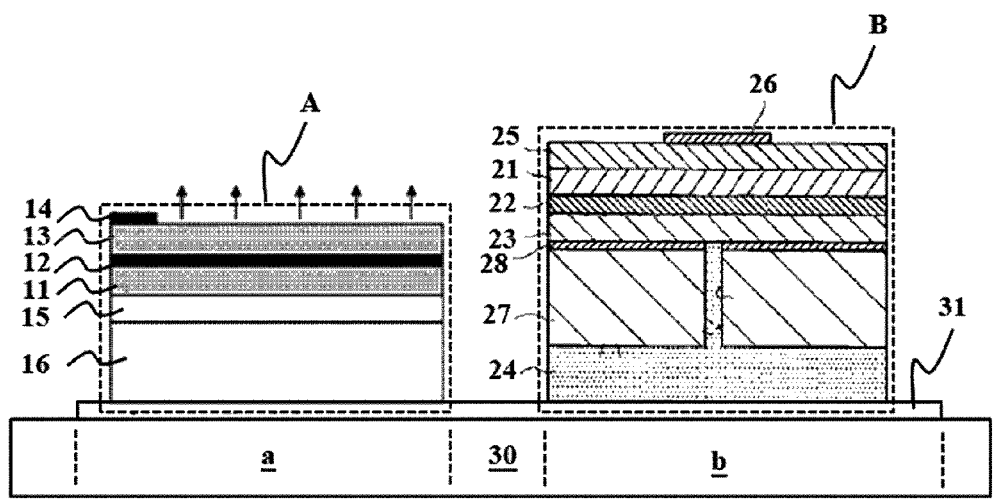
FIG. 5 is a view illustrating an example of a semiconductor light emitting unit connected body according to the present disclosure.

FIG. 5 is a view illustrating an example of a semiconductor light emitting unit connected body according to the present disclosure, in which a light emitting unit or part A and a light emitting unit or part B are serially connected to form a connected body or a connection assembly. Unlike the light emitting parts A and B in FIG. 4, the light emitting part A and the light emitting part B in this example are individual chips, prepared by a separate chip process. As such, the light emitting parts are simply attached to a connecting plate 30 and form a connection assembly together, without going through any complicated process.

While the connecting plate 30 may involve a conductive layer 31 to electrically connect the light emitting parts A and B, the conductive layer 31 can be omitted in case the connecting plate 30 is made of an electrically conductive material. The connecting plate 30 can be a PCB, a lead frame in case of a package, a plate with a conductive pattern formed thereon, a semiconductor such as silicone with a pattern formed by doping, or a submount having a conductive layer 31, or can further include a submount between the conductive layer 31 and the connecting plate 30 (this configuration can be useful for one in FIG. 8). Meanwhile, it is not likely that both light emitting parts A and B are bonded to the connecting plate 30 during their manufacturing process, and it is not possible either. For instance, the conductive layer 31 is a material system featuring the properties of adhesion, heat transfer, optical reflection, and electrical conductivity, which can be formed of a material chosen from Ag, Al, Au, Cu, Pd, Ni, Pt, Rh, Mo, Si, Ge, Sn and In, or of any alloy, complex or solid solution containing at least one of the materials. The connecting plate 30 is a material system featuring the properties of heat transfer, structural stability and adhesion, which can be formed of a material chosen from Al, Cu, Si, C, Mo and Be, or of any oxide, nitride or carbide containing at least one of the materials.

The light emitting part A is a so-called vertical light emitting diode. The vertical light emitting diode herein indicates a light emitting diode obtained by growing semiconductor layers 11, 12 and 13 on an appropriate substrate (e.g. sapphire, SiC, Si, AlN, AlGaN, GaN) by MOCVD for example, and then removing the substrate by laser or wet etching, followed by forming an electrode 14, 15 on either side of the semiconductor layers 11 and 13. The active layer 12 generates light via electron-hole recombination. For the emission of UV, blue or green light, Group III nitrides (e.g. InGaN, GaN, AlGaInN) are usually used for the material of the active layer 12. The semiconductor layer 13, which is involved in light emission, typically becomes an n-type semiconductor layer, and the semiconductor layer 11 on the opposite side becomes a p-type semiconductor layer, but this can be the other way around. The electrode 15 serves to diffuse current to the semiconductor layer 11, and it can be light transmissive by nature or act as a reflective film. It can be omitted as well. A supporting substrate 16 is used to protect the device during the substrate removal process. For instance, the electrode 15 can be Ag, Al, Pd, Cu, Pt, Ni, Au, $In_2O_3$: (Sn, Mo, Ti, F, Zn), ZnO : (Al, In, Ga), $SnO_2$: (Sb, F), NiO or $CuAlO_2$, while the supporting substrate 16 can be a Si, Ge or GaAs wafer; or an electrically conductive alloy, complex, solid-solution or multi-layer laminate material system, containing at least one of elements chosen from W, Mo, Al, Ag, Cu, Ni, Au, Si and C. Although not shown in FIG. 5, an adhesive material (layer) and a diffusion barrier material (layer) for preventing any diffusion between materials are preferably applied between the electrode 15 and the supporting substrate 16.

The light emitting part B, unlike the light emitting part A, is a type of a light emitting diode that retains a growth substrate 27. A semiconductor 23 corresponds to the semiconductor layer 13, and a semiconductor layer 22 corresponds to the semiconductor layer 12. An electrode 25 that serves to diffuse current to the semiconductor layer 21 can be omitted. However, since the performance of a device is considerably degraded without the electrode, most of the devices available now have an electrode 25. The electrode 25 is formed by a light-transmissive material, such as ITO. An electrode 24 passes through the substrate 27 and is connected to the semiconductor layer 23. To increase the crystallinity of semiconductor layers 21, 22 and 23 on the substrate 27, a semiconductor layer 28 is usually provided. Considering the current techniques for growing a semiconductor layer, it may not be easy to grow a p-type semiconductor layer directly on the substrate 27. Generally, the semiconductor layer 13 in the light emitting part A becomes an n-type semiconductor layer, and the semiconductor layer 21 in the light emitting part B becomes a p-type semiconductor layer. Here, the semiconductor layer 23 becomes an n-type semiconductor layer for the serial connection of the light emitting parts A and B.

The light emitting parts A and B are typically light emitting diodes, but can also be laser diodes.

A conducting region of the conductive layer 31 and the connecting plate 30 below the light emitting part A is referred to as a conductive portion a, and a conducting region of the conductive layer 31 and the connecting plate 30 below the light emitting part B is referred to as a conductive portion b.

Figure 3:
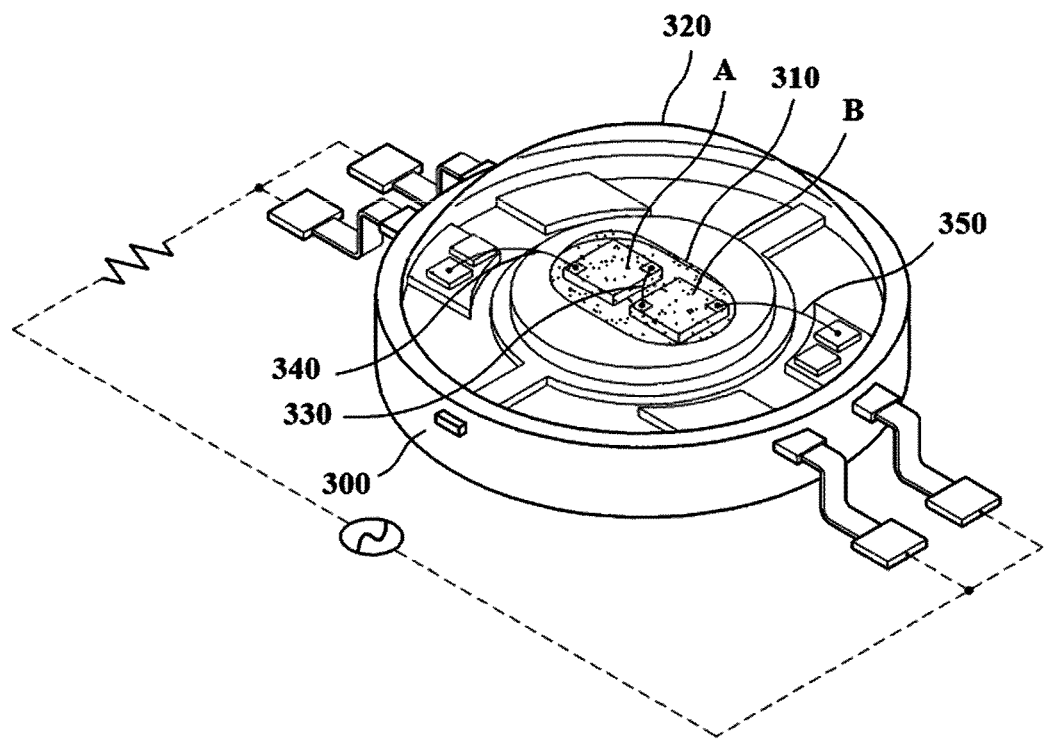
FIG. 3 is a view illustrating another example of a serial connection of light emitting diodes.

This configuration makes it possible to serially connect two independent light emitting parts A and B, without a wire 330 for connecting the light emitting parts A and B as in the light emitting diode in FIG. 3.

Figure 6:
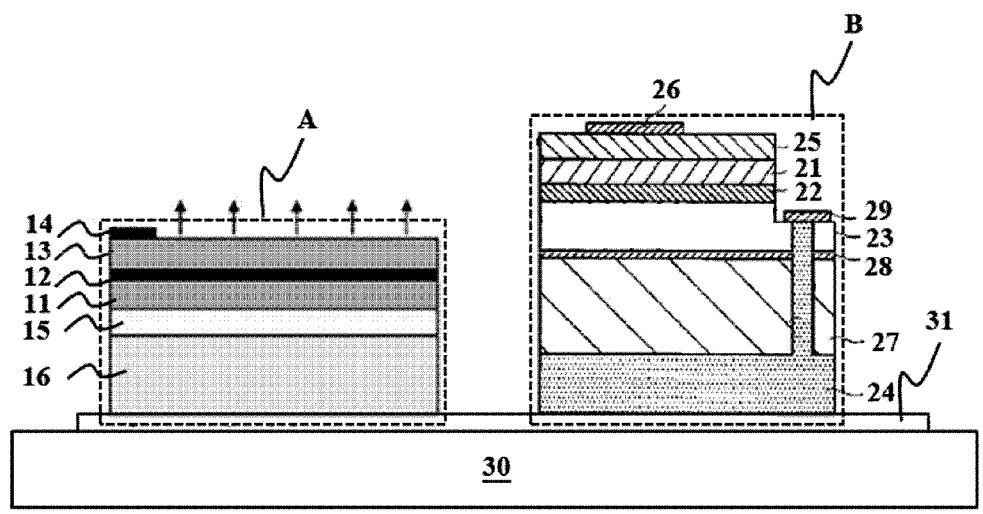
FIG. 6 is a view illustrating another example of a semiconductor light emitting unit connected body according to the present disclosure.

FIG. 6 is a view illustrating another example of a semiconductor light emitting unit connected body according to the present disclosure. In this light emitting part B, an electrode 24 passes through a substrate 27, reaching an exposed area by etching semiconductor layers 21, 22 and 23, and an electrode 29 is then formed on the exposed area. The presence of the electrode 29 can facilitate current supply to the semiconductor layer 23 even more.

Figure 1:
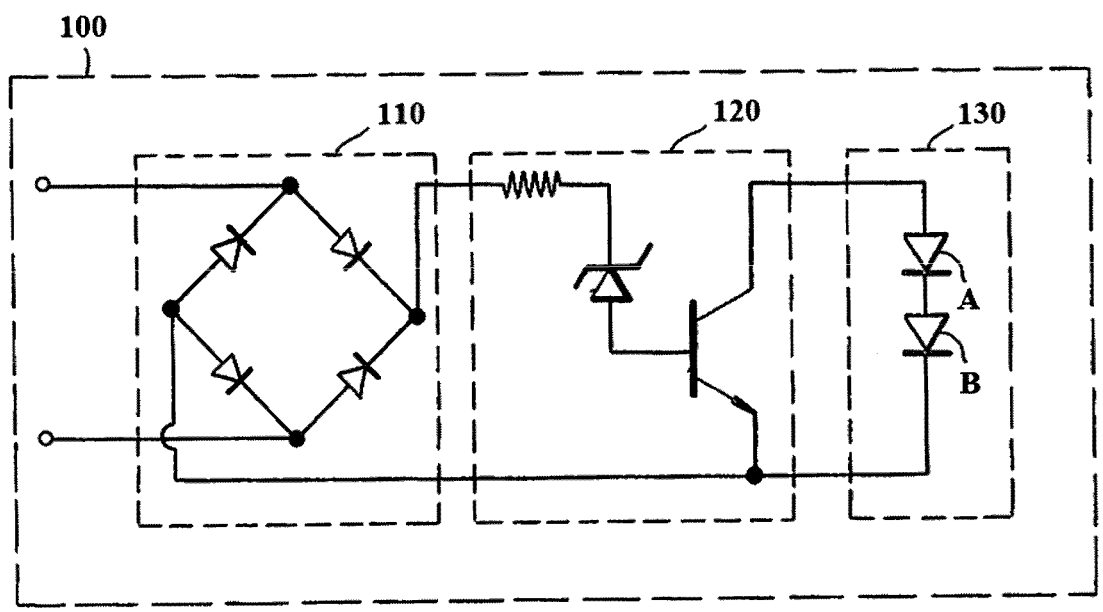
FIG. 1 is a view illustrating an example of a lamp employing light emitting diodes.
Figure 2:
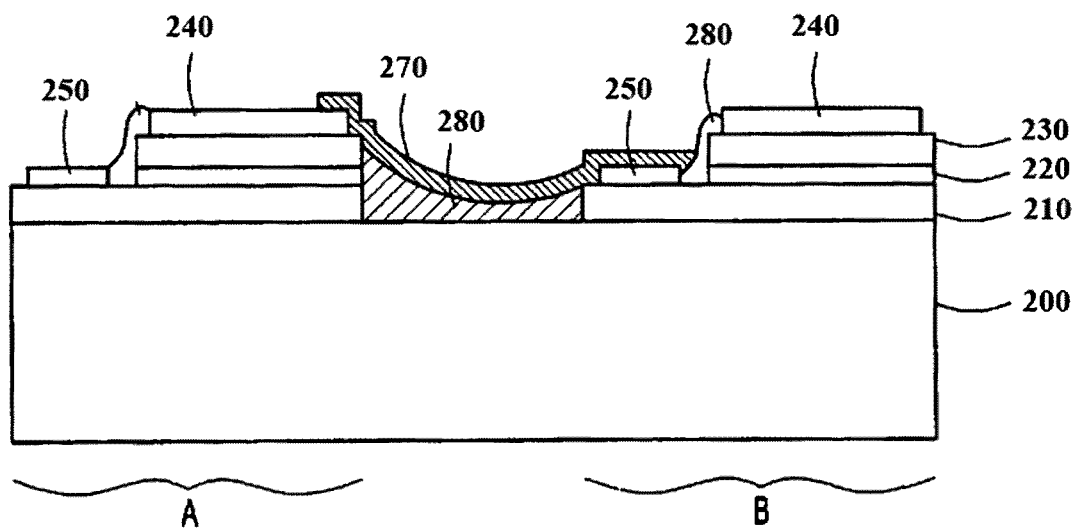
FIG. 2 is a view illustrating an example of a serial connection of light emitting diodes.
Figure 7:
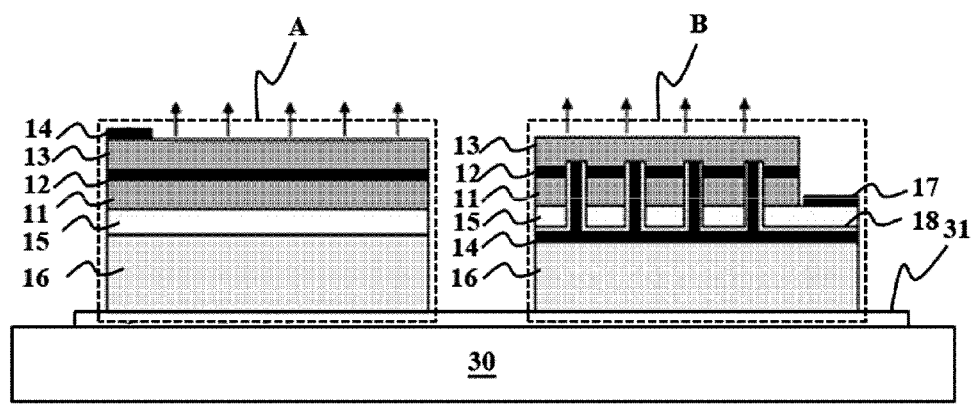
FIG. 7 is a view illustrating yet another example of a semiconductor light emitting unit connected body according to the present disclosure.

FIG. 7 is a view illustrating yet another example of a semiconductor light emitting unit connected body according to the present disclosure, in which the light emitting part B has the same epitaxial structure as the light emitting part B, but with a different configuration of electrodes. That is to say, in the light emitting part A, an electrode 14 supplying power to the semiconductor layer 13 is formed on the semiconductor layer 13; in the light transmitting part B, the electrode 14 is formed between a supporting substrate 16 and an electrode 15 supplying power to the semiconductor layer 11. A dielectric layer 18 (e.g. $SiO_2$, $SiN_x$, or $Al_2O_3$) is provided for insulating the electrodes 14 and 16, and for supplying power to the semiconductor layer 13, passing through the epitaxial structure 11, 12 and 13. The electrode 17 serves as a pad for wire bonding to the electrode 15. For a reflective film, any one of the following is acceptable: the electrode 15, the supporting substrate 16, the conductive layer 31, or a separate metal layer, distributed bragg reflector (DBR) or omni-directional reflector (ODR) disposed between the supporting substrate 16 and the conductive layer 31. In terms of attaining a serial connection between the light emitting parts A and B as in FIG. 1, this configuration is advantageous in that it does not require an electrical connection through the metal layer 270 in the chip process between the light emitting parts A and B as in FIG. 2, additional wire 330 bonding as in FIG. 3, and a complicated chip process between the substrate 493 and the epitaxial structures 410, 420 and 430 as in FIG. 4. Compared with the configurations shown in FIG. 5 and FIG. 6, the absence of the substrate 27 enables an excellent heat dissipation capability through the connecting plate 30, and also prevents light absorption by the electrodes 25 and 26. Moreover, in the light emitting part B, as the electrode 17 for wire bonding is located below the active layer 12, light absorption by the wire can also be prevented.

Figure 8:
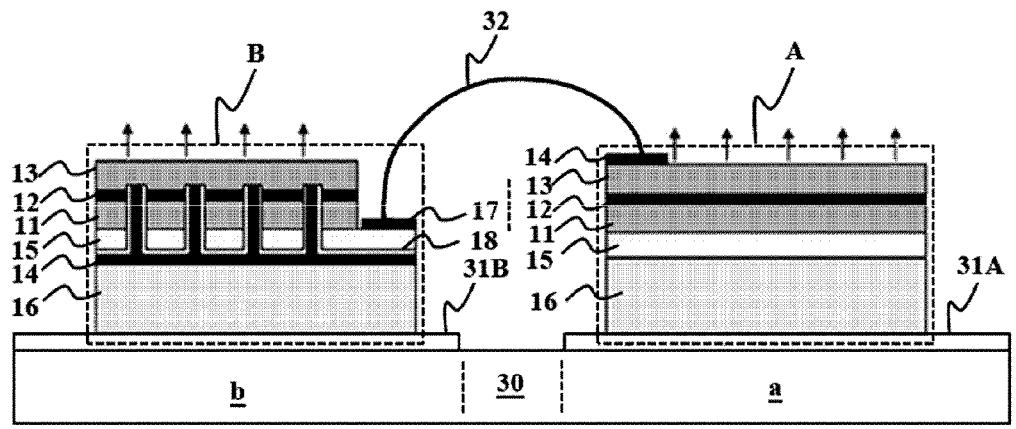
FIG. 8 is a view illustrating yet example of a semiconductor light emitting unit connected body according to the present disclosure.

FIG. 8 is a view illustrating yet another example of a semiconductor light emitting unit connected body according to the present disclosure, in which a connecting plate 30 has a conductive layer 31A and a conductive layer 31B, which are electrically isolated from each other. The serial connection of the light emitting parts A and B is accomplished through a wire 32. With this configuration, it is possible to obtain a connection assembly with serially connected semiconductor light emitting parts through one single wire 32 bonding. All those advantages of the connection assembly shown in FIG. 7 are also found in this configuration. Here, a conducting region of the conductive layer 31A and the connecting plate 30 below the light emitting part A is referred to as a conductive portion a, and a conducting region of the conductive layer 31B and the connecting plate 30 below the light emitting part B is referred to as a conductive portion b.

Figure 9:
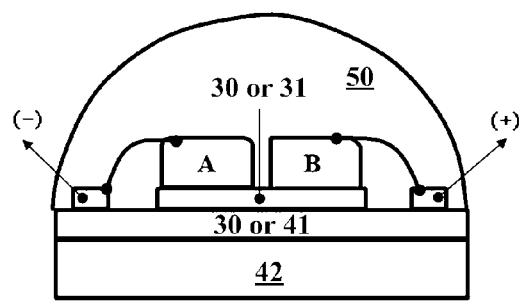
FIG. 9 is a view illustrating an example of the application of the semiconductor light emitting unit connected body according to the present disclosure.

FIG. 9 is a view illustrating an example of the application of the semiconductor light emitting unit connected body according to the present disclosure, in which a semiconductor light emitting unit connected body A, B and 30 is placed on top of a lower plate 41 and surrounded with an encapsulant 50 (e.g. a phosphor-containing epoxy resin). A (+) terminal and a (−) terminal are provided on top of the lower plate 41, and a separate heat sink 42 can be located under the lower plate 41. The lower plate 41 has an electric pattern and can serve as a reflector. A typical example of the lower plate 41 is a PCB. This particular application can be found in packages, COBs (Chips on Board), lighting lamps, and so forth. This configuration facilitates obtaining of a serial connection such as one in FIG. 1, simply by adhering the light emitting unit connected body A, B and 30 to the lower plate 41, and then connecting the (+) and (−) terminals thereto. The connecting plate 30 can be used as the lower plate 41, and in such a case, the connecting plate 30 corresponds to the conductive layer 31. Prior to the application of the encapsulant 50, phosphor can be conformally coated. This provides benefits, such as, a decrease in phosphor consumption as well as a decrease in process time.

Figure 10:
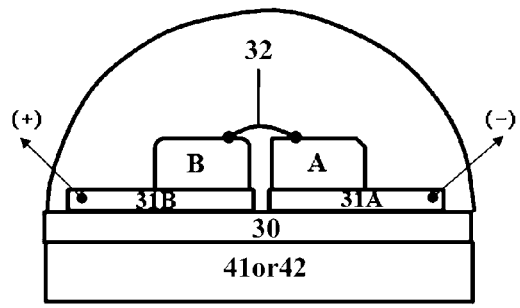
FIG. 10 is a view illustrating another example of the application of the semiconductor light emitting unit connected body according to the present disclosure.

FIG. 10 is a view illustrating another example of the application of the semiconductor light emitting unit connected body according to the present disclosure. It shows that a package, a lamp, etc. can be obtained using only one wire 32 for the light emitting unit connected body A, B, 30, 31A, 31B and 32 (see FIG. 8). To avoid redundancy in explaining, like or similar elements designated by the same reference numerals throughout the views will not be explained.

Figure 11:
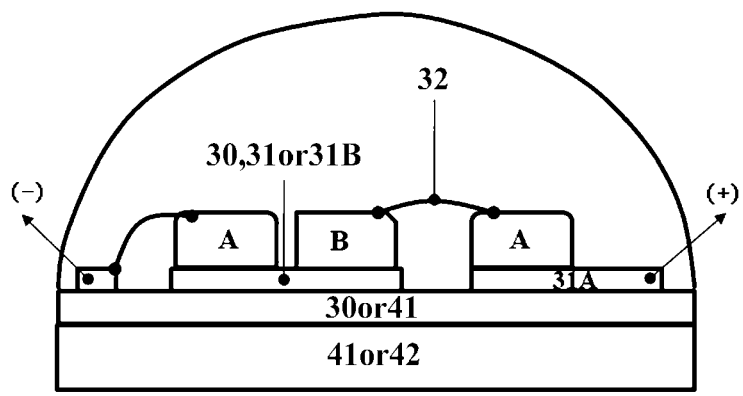
FIG. 11 is a view illustrating yet another example of the application of the semiconductor light emitting unit connected body according to the present disclosure.

FIG. 11 is a view illustrating yet another example of the application of the semiconductor light emitting unit connected body according to the present disclosure, in which the connection assembly A, B, 30 and 31 shown in FIG. 8 is combined with the connection assembly A, B, 30, 31A, 31B and 32 shown in FIG. 9, to obtain a package, a lamp, etc. According to this configuration, three independent chips can be connected in series using only two wires. By taking the connection assembly A, B, 30 and 31 as one independent component, two components are placed on top of the lower plate 41, 42, thereby enabling a serial connection of three independent chips.

Figure 12:
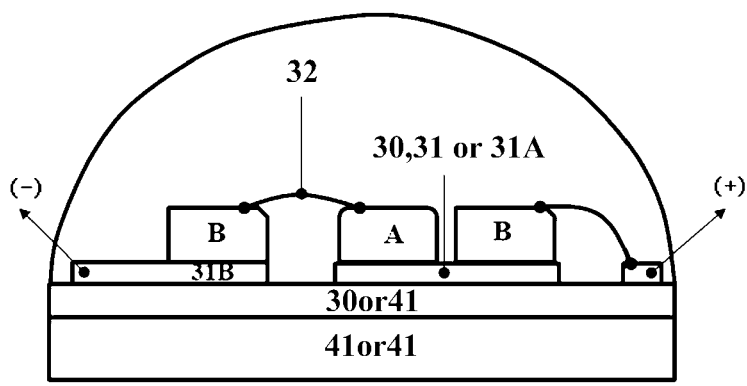
FIG. 12 is a view illustrating yet another example of the application of the semiconductor light emitting unit connected body according to the present disclosure.

FIG. 12 is a view illustrating yet another example of the application of the semiconductor light emitting unit connected body according to the present disclosure, in which one light emitting part B is placed on top of the conductive layer 31B, thereby enabling a serial connection of three independent chips A, B and A. To avoid redundancy in explaining, like or similar elements designated by the same reference numerals throughout the views will not be explained.

Figure 13:
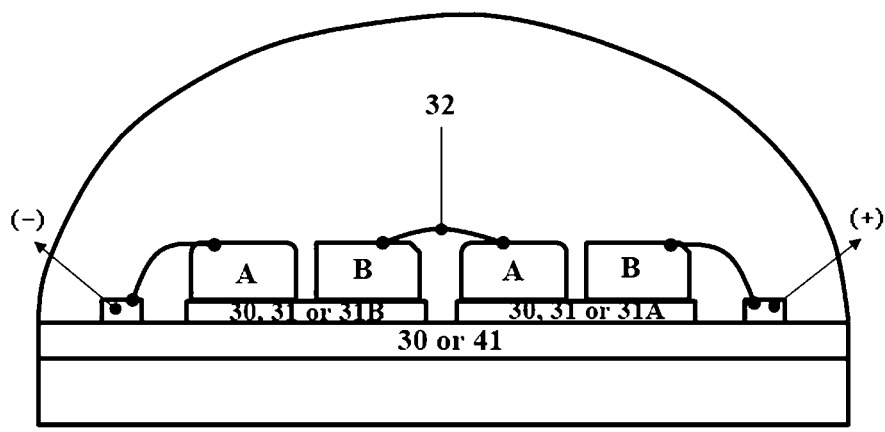
FIG. 13 is a view illustrating yet another example of the application of the semiconductor light emitting unit connected body according to the present disclosure.

FIG. 13 is a view illustrating yet another example of the application of the semiconductor light emitting unit connected body according to the present disclosure, in which four chips are connected in series.

Figure 14:
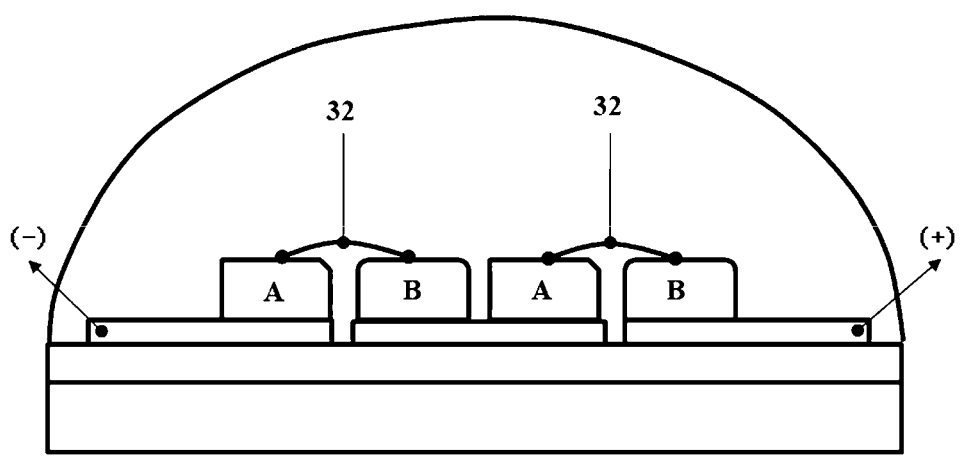
FIG. 14 is a view illustrating yet another example of the application of the semiconductor light emitting unit connected body according to the present disclosure.

FIG. 14 is a view illustrating yet another example of the application of the semiconductor light emitting unit connected body according to the present disclosure, in which four independent chips are serially connected using only two wires 32's.

Figure 15:
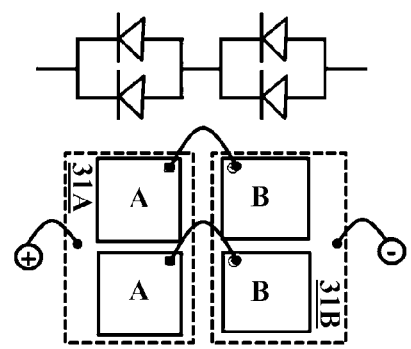
FIG. 15 is a view illustrating yet another example of the application of the semiconductor light emitting unit connected body according to the present disclosure.

FIG. 15 is a view illustrating yet another example of the application of the semiconductor light emitting unit connected body according to the present disclosure, in which a plurality of light emitting parts A and B is placed on top of a conductive layer 31A and a conductive layer 31B, thereby forming an array of the light emitting parts on each of the conductive layers 31A and 31B.

Figure 16:
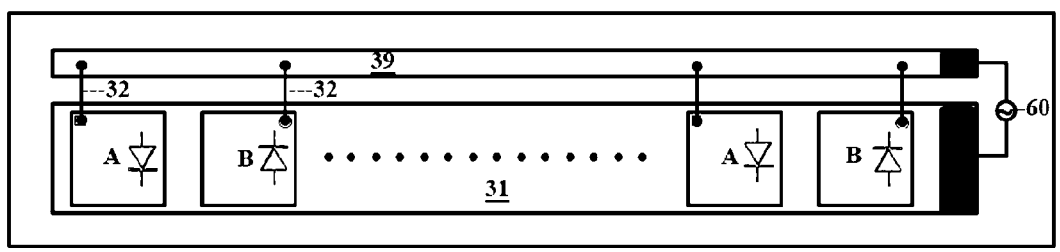
FIG. 16 is a view illustrating yet another example of the application of the semiconductor light emitting unit connected body according to the present disclosure.

FIG. 16 is a view illustrating yet another example of the application of the semiconductor light emitting unit connected body according to the present disclosure, in which a light emitting part A and a light emitting part B are placed on top of a conductive layer 31, and an additional conducting line 39 is provided. The conducting line 39 and the light emitting parts A and B are connected by wires 32's, respectively. By introducing the conducting line 39, it is possible to obtain a parallel connection between the light emitting parts A's and a parallel connection between the light emitting parts B's, while retaining the basic configuration where the light emitting parts A and B are connected by the conductive layer 31. When the connection assembly is connected to an AC power supply 60 and a (+) waveform is generated, the light emitting parts A's are then connected to the (−) side of the AC power supply 60 and the light emitting parts B's are connected to the (+) side of the AC power supply 60. When a (−) waveform is generated, the light emitting parts A's are connected to the (+) side of the AC power supply 60 and the light emitting parts B's are connected to the (−) side of the AC power supply 60. This configuration makes it possible to use both AC waveforms, even without using a bridge diode.

The following will now describe various exemplary embodiments of the present disclosure.

(1) A semiconductor light emitting unit connected body, characterized by comprising: a first light emitting unit which includes a first semiconductor layer of a first conductivity type, a second semiconductor layer of a second conductivity type different from the first conductivity type, an active layer interposed between the first semiconductor layer and the second semiconductor layer, and a current supplying layer formed at the bottom; a second light emitting unit which includes a first semiconductor layer of a first conductivity type, a second semiconductor layer of a second conductivity type different from the first conductivity type, an active layer interposed between the first semiconductor layer and the second semiconductor layer, and a current supplying layer formed at the bottom and extended into the second light emitting unit; a connecting plate to which the first and second light emitting units are fixed, the connecting plate having a conductive portion where the first light emitting unit is placed, and a conductive portion where the second light emitting unit is placed; and an electric pass for electrically connecting one of the first and second semiconductor layers in the first light emitting unit with one of the first and second semiconductor layers in the second light emitting unit, wherein the electrically connected semiconductor layers have different conductive type from each other. When the first conductivity has an n type, the second conductivity has a p type. Similarly, when the first conductivity has a p type, the second conductivity has an n type. The light emitting unit can be a light emitting diode or a laser diode. The current supplying layer can be formed by the electrode 14, the electrode 15, the supporting substrate 16 and the electrode 24. When a sufficient current flow can be supplied to the light emitting unit, it is not absolutely necessary to form the current supplying layer over the entire lower surface of the light emitting unit.

(2) A semiconductor light emitting unit connected body, wherein the conductive portion of the second light emitting unit is extended below the active layer. Good examples of this configuration are illustrated in FIGS. 5 and 6.

(3) A semiconductor light emitting unit connected body, wherein the electric pass is formed at the connecting plate. Good examples of this configuration are illustrated in FIGS. 5 to 7.

(4) A semiconductor light emitting unit connected body, wherein the conductive portion of the second light emitting unit is extended above the active layer. Good examples of this configuration are illustrated in FIGS. 5 and 6.

(5) A semiconductor light emitting unit connected body, wherein the electric pass is formed by a wire. A good example of this configuration is illustrated in FIG. 8.

(6) A semiconductor light emitting unit connected body, wherein, in the connecting plate, the first light emitting unit and the second light emitting unit are electrically insulated to each other. A good example of this configuration is illustrated in FIG. 8.

(7) A semiconductor light emitting unit connected body, wherein the second light emitting unit includes an electrode to which the wire is bonded below the active layer. Good examples of this configuration are illustrated in FIGS. 7 and 8.

(8) A semiconductor light emitting unit connected body, wherein the first light emitting unit and the second light emitting unit are electrically connected to outside by two wires. A good example of this configuration is illustrated in FIG. 9.

(9) A semiconductor light emitting unit connected body, wherein the first light emitting unit and the second light emitting unit are electrically connected to outside by the conductive portion of the first light emitting unit and the conductive portion of the second light emitting unit. A good example of this configuration is illustrated in FIG. 10.

(10) A semiconductor light emitting unit connected body comprising a third light emitting unit of the same configuration as the first light emitting unit, with the third light emitting unit being electrically connected to the second light emitting unit by a wire. A good example of this configuration is illustrated in FIG. 11.

(11) A semiconductor light emitting unit connected body comprising a third light emitting unit of the same configuration as the second light emitting unit, with the third light emitting unit being electrically connected to the first light emitting unit by a wire. A good example of this configuration is illustrated in FIG. 12.

(12) A semiconductor light emitting unit connected body comprising a fourth light emitting unit of the same configuration as the second light emitting unit, with the fourth light emitting unit being electrically connected to the third light emitting unit by a wire. A good example of this configuration is illustrated in FIG. 13.

(13) A semiconductor light emitting unit connected body comprising a fourth light emitting unit of the same configuration as the first light emitting unit, with the fourth light emitting unit being electrically connected to the second light emitting unit by a wire. A good example of this configuration is illustrated in FIG. 14.

(14) A semiconductor light emitting unit connected body comprising a conducting line for electrically connecting the other of the first and second semiconductor layers in the first light emitting unit with the other of the first and second semiconductor layers in the second light emitting unit, wherein the electric pass is connected to one of (+) and (−) sides of an AC power supply, and the conducting line is connected to the other of the (+) and (−) sides of the AC power supply. A good example of this configuration is illustrated in FIG. 16.

(15) A semiconductor light emitting unit connected body, wherein the other of the first and second semiconductor layers in the first light emitting unit is connected with the conducting line by a wire, and wherein the other of the first and second semiconductor layers in the second light emitting unit is connected with the conducting line by a wire. A good example of this configuration is illustrated in FIG. 16.

(16) A semiconductor light emitting unit connected body, wherein the connecting configurations in FIGS. 7 to 14 are multiply used. This is particularly suitable for LED modules of lighting and COBs.

With a semiconductor light emitting unit connected body according to the present disclosure, it is easy to connect light emitting parts in series.

Also, with a semiconductor light emitting unit connected body according to the present disclosure, it is easy to connect light emitting parts in parallel.

Moreover, with a semiconductor light emitting unit connected body according to the present disclosure, it is possible to produce high-current, high-power light emitting diode or laser diode packages, COBs, lamps or the like.

Further, a semiconductor light emitting unit connected body manufactured according to the present disclosure features an increased heat dissipation capability.

What is claimed is:

1. A semiconductor light emitting apparatus, comprising:
 a first light emitting unit which includes a first semiconductor layer of a first conductivity type, a second semiconductor layer of a second conductivity type different from the first conductivity type, an active layer interposed between the first semiconductor layer and the second semiconductor layer, and a current supplying layer formed at the bottom;
 a second light emitting unit which includes a first semiconductor layer of a first conductivity type, a second semiconductor layer of a second conductivity type different from the first conductivity type, an active layer interposed between the first semiconductor layer and the second semiconductor layer, and a current supplying layer formed at the bottom and extended into the second light emitting unit;
 a connecting plate to which the first and second light emitting units are fixed, the connecting plate having a conductive portion where the first light emitting unit is placed and which is electrically connected with the current supplying layer of the first light emitting unit, and a conductive portion where the second light emitting unit is placed and which is electrically connected with the second light emitting unit; and
 an electric pass for electrically connecting one of the first and second semiconductor layers in the first light emitting unit with one of the first and second semiconductor layers in the second light emitting unit, wherein the electrically connected semiconductor layers have different conductive type from each other.

2. The semiconductor light emitting apparatus as claimed in claim 1, wherein the conductive portion of the second light emitting unit is extended below the active layer.

3. The semiconductor light emitting apparatus as claimed in claim 2, wherein the electric pass is formed at the connecting plate.

4. The semiconductor light emitting apparatus as claimed in claim 1, wherein the conductive portion of the second light emitting unit is extended above the active layer.

5. The semiconductor light emitting apparatus as claimed in claim 4, wherein the electric pass is formed at the connecting plate.

6. The semiconductor light emitting apparatus as claimed in claim 5,
 wherein, in the first light emitting unit, the second semiconductor layer is located on the opposite side of the current supplying layer with respect to the active layer, with the second semiconductor layer having an n-type conductivity,
 wherein, in the second light emitting unit, the second semiconductor layer is located on the opposite side of the current supplying layer with respect to the active layer, the second semiconductor layer having an n-type conductivity,
 wherein the first semiconductor layer of the first light emitting unit and the first semiconductor layer of the second light emitting unit are electrically connected with respective current supplying layers, after the removal of a growth substrate, and
 wherein the second light emitting unit includes an electrode to which a wire is bonded below the active layer.

7. The semiconductor light emitting apparatus as claimed in claim 5, wherein the first light emitting unit and the second light emitting unit are electrically connected to outside by two wires.

8. The semiconductor light emitting apparatus as claimed in claim 7, further comprising:
 a third light emitting unit of the same configuration as the first light emitting unit, with the third light emitting unit being electrically connected to the second light emitting unit by a wire.

9. The semiconductor light emitting apparatus as claimed in claim 8, further comprising:
 a fourth light emitting unit of the same configuration as the second light emitting unit, with the fourth light emitting unit being electrically connected to the third light emitting unit by a wire.

10. The semiconductor light emitting apparatus as claimed in claim 5, further comprising:
 a conducting line for electrically connecting the other of the first and second semiconductor layers in the first light emitting unit with the other of the first and second semiconductor layers in the second light emitting unit,
 wherein the electric pass is connected to one of (+) and (−) sides of an AC power supply, and the conducting line is connected to the other of the (+) and (−) sides of the AC power supply.

11. The semiconductor light emitting apparatus as claimed in claim 10, wherein the other of the first and second semiconductor layers in the first light emitting unit is connected with the conducting line by a wire, and wherein the other of the first and second semiconductor layers in the second light emitting unit is connected with the conducting line by a wire.

12. The semiconductor light emitting apparatus as claimed in claim 4, wherein the electric pass is formed by a wire.

13. The semiconductor light emitting apparatus as claimed in claim 12, wherein, in the connecting plate, the first light emitting unit and the second light emitting unit are electrically insulated to each other.

14. The semiconductor light emitting apparatus as claimed in claim 13,
 wherein, in the first light emitting unit, the second semiconductor layer is located on the opposite side of the current supplying layer with respect to the active layer, with the second semiconductor layer having an n-type conductivity,
 wherein, in the second light emitting unit, the second semiconductor layer is located on the opposite side of the current supplying layer with respect to the active layer, the second semiconductor layer having an n-type conductivity,
 wherein the first semiconductor layer of the first light emitting unit and the first semiconductor layer of the second light emitting unit are electrically connected with respective current supplying layers, after the removal of a growth substrate, and
 wherein the second light emitting unit includes an electrode to which the wire is bonded below the active layer.

15. The semiconductor light emitting apparatus as claimed in claim 12, wherein the second light emitting unit includes an electrode to which the wire is bonded below the active layer.

16. The semiconductor light emitting apparatus as claimed in claim 12, wherein the first light emitting unit and the second light emitting unit are electrically connected to outside by the conductive portion of the first light emitting unit and the conductive portion of the second light emitting unit.

17. The semiconductor light emitting apparatus as claimed in claim 16, further comprising:
a third light emitting unit of the same configuration as the second light emitting unit, with the third light emitting unit being electrically connected to the first light emitting unit by a wire.

18. The semiconductor light emitting apparatus as claimed in claim 17, further comprising:
a fourth light emitting unit of the same configuration as the first light emitting unit, with the fourth light emitting unit being electrically connected to the second light emitting unit by a wire.

19. The semiconductor light emitting apparatus as claimed in claim 4,
wherein, in the first light emitting unit, the second semiconductor layer is located on the opposite side of the current supplying layer with respect to the active layer,
wherein, in the second light emitting unit, the second semiconductor layer is located on the opposite side of the current supplying layer with respect to the active layer, and
wherein the first semiconductor layer of the first light emitting unit and the first semiconductor layer of the second light emitting unit are electrically connected with respective current supplying layers, after the removal of a growth substrate.

20. The semiconductor light emitting apparatus as claimed in claim 19, wherein the second semiconductor layer of the first light emitting unit and the second semiconductor layer of the second light emitting unit have an n-type conductivity.

* * * * *